United States Patent
Sheu et al.

(10) Patent No.: US 7,669,498 B2
(45) Date of Patent: Mar. 2, 2010

(54) SELF-ADJUSTABLE AND CROSS-CHAMBER TRANSMISSION SYSTEM

(75) Inventors: Geeng-Jen Sheu, Taichung (TW); Tuan-Jen Yu, Pingtung County (TW); Chung-Chung Liu, Taichung County (TW); Chien-Ming Li, Taichung County (TW); Hsin-Lun Wu, Taichung City (TW)

(73) Assignee: Hsiuping Institute of Technology, Dali, Taichung (TW)

( * ) Notice: Subject to any disclaimer, the term of this patent is extended or adjusted under 35 U.S.C. 154(b) by 1239 days.

(21) Appl. No.: 11/200,062

(22) Filed: Aug. 10, 2005

(65) Prior Publication Data
US 2007/0034508 A1 Feb. 15, 2007

(51) Int. Cl.
*F16H 1/04* (2006.01)
(52) U.S. Cl. ............... 74/422; 74/409; 74/411; 198/465.3; 414/173; 414/196
(58) Field of Classification Search ............... 74/89.17, 74/395, 396, 397, 400, 401, 411, 422, 409; 198/465.1, 465.3; 414/159, 173, 176, 196, 414/198, 209, 211, 214, 331.09, 331.13, 414/417, 937, 939
See application file for complete search history.

(56) References Cited
U.S. PATENT DOCUMENTS

| | | | | | |
|---|---|---|---|---|---|
| 2,466,218 | A | * | 4/1949 | Farrell et al. | 464/75 |
| 3,593,593 | A | * | 7/1971 | Bradshaw | 74/498 |
| 5,388,684 | A | * | 2/1995 | Peck | 198/465.1 |
| 6,155,129 | A | * | 12/2000 | Dorfschmid et al. | 74/473.12 |

* cited by examiner

Primary Examiner—William C Joyce
(74) Attorney, Agent, or Firm—Birch, Stewart, Kolasch & Birch, LLP

(57) ABSTRACT

A transmission system includes two or more independent chambers, in each of which shafts with gears thereon are provided for rolling in synchronous motion, and a carrier with adjustable gear devices on a bottom thereof. Each of the adjustable gear devices has a base, a movable rack member, vertical springs and horizontal springs. The movable rack member is connected to the base to be moved along a horizontal direction. The vertical springs are provided between the base and the carrier to urge the adjustable gear device along a vertical direction. The movable rack member has a rack portion to be meshed with the gears of the shafts, such that the carrier is moved by the gears to cross the chambers. With the movement of the movable rack member both along the horizontal and the vertical direction, the carrier is transported in a smooth, synchronous, skid-proof, stable and real-time motion during the crossing chamber process.

6 Claims, 8 Drawing Sheets

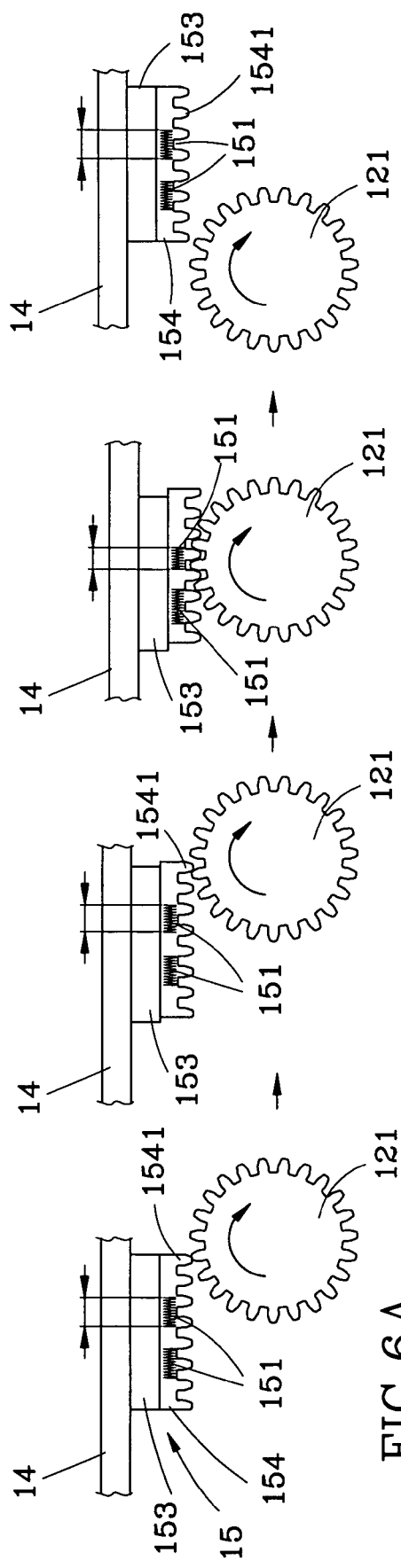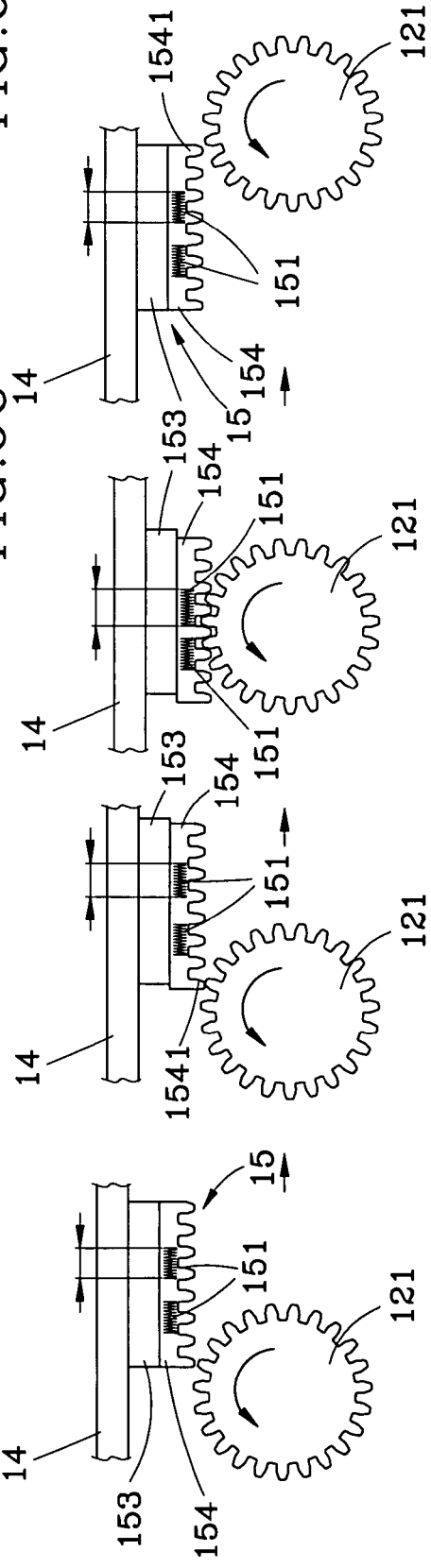

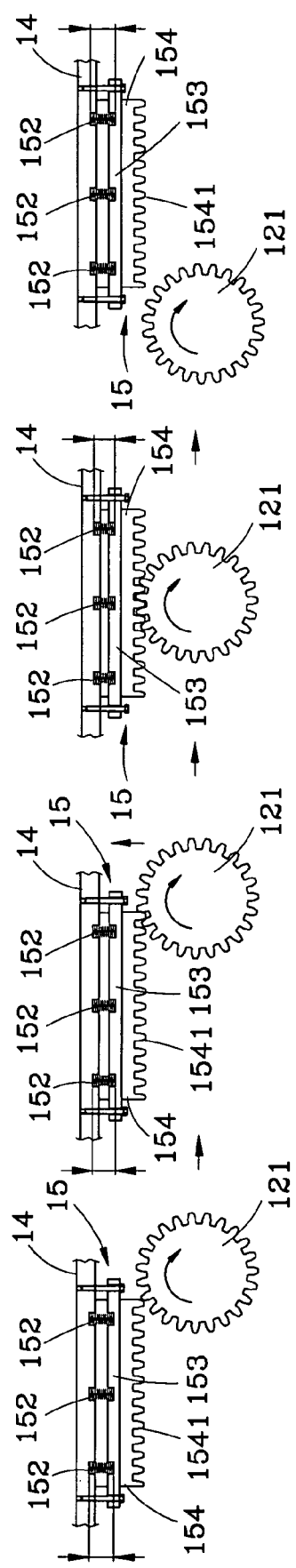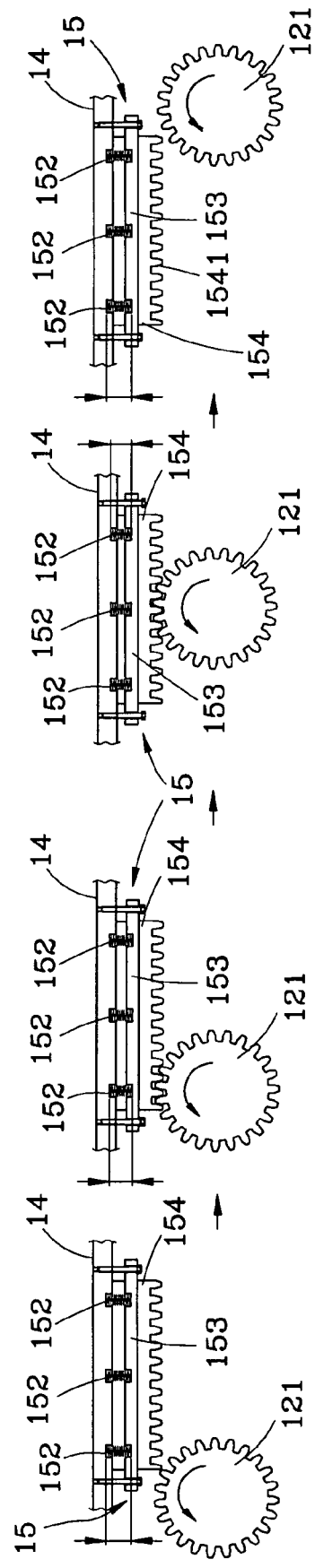

US 7,669,498 B2

SELF-ADJUSTABLE AND CROSS-CHAMBER TRANSMISSION SYSTEM

BACKGROUND OF THE INVENTION

1. Field of the Invention

The present invention relates generally to an in-line and multi-chamber sputtering process of vacuum deposition system, and more particularly to a self-adjustable and cross-chamber transmission system.

2. Description of the Related Art

FIG. 1 shows the flow chart of the in-line sputtering process. FIG. 2 is a sketch diagram of the conventional sputter system, which is consisted at least a load chamber 50, a sputter chamber 52 for reactive magnetron sputtering process, and an unload chamber 54. Because the vacuum requirements of sputtering process, prior to the sputtering procedure a vacuum of less than one ten millionth of an atmosphere must be achieved. Gates 56 are provided between the chambers 50, 52, and 54 for isolation with the neighboring chambers. According to the quality requirement of sputtering, more modular sub-chambers can be added to the system for pre-treatment and post-treatment of gradient vacuum conditions. These additional sub-chambers are used to achieve the required vacuum and clearance requirements gradually. Each chamber has an independent transmission device therein (not shown in FIG. 2) to transport a carrier 14, on which the substrate is rested, crossing the chambers. The conventional transmission device includes a plurality of parallel shafts pivoted on a bottom of the chamber. To achieve a real-time and synchronous motion, the shafts are connected with each other by chains or teeth belts and are driven by a motor. A carrier, on which substrates are placed, is rested on the shafts for transport from the front chamber to the next. A limit switch and a PLC controller are provided to control the motion process of the carrier crossing the chambers, and the open/close process of the gates.

For the isolation of the gates 56, the conventional transmission device applied the friction force between the shafts and the carrier to transport the carrier crossing the chambers. However, the skid and slip may be occurred on the carrier because of insufficient friction or unequal distribution of friction. Typically, the shafts are provided and installed with plastic O-rings at both sides to increase the friction coefficient. However, the O-rings will be worn gradually during transport process. After some time, the dust and particles of the O-rings are deposited in the chamber and on a bottom of the transmission device. In the sputtering process, the dust and particles will be diffused in the vacuum condition and then pollute the cleanness of the chamber. It will cause unusual convexity or exceptional penetrability. Not only the bonding force and uniformity of the coating surfaces, but also the optical characteristics and electrical functions of the products are affected. As a result, the conventional sputtering system needs to shut down periodically for clearing the dust on the surfaces of the chamber and the transmission device after a predetermined time. It decreases the activation and the efficiency of the system. Moreover, the deposited dust and particles produced by wear and abrasion can't be avoided for the conventional transmission device, and the impractical operation of clearing still can't completely prevent the system from the above drawbacks. Moreover, the unequal friction distribution of the shafts at both sides may cause unexpected skew or tremulous motion, and hence result in instability of the transport.

SUMMARY OF THE INVENTION

The primary objective of the present invention is to provide a transmission system, which transports the carrier crossing the chambers in a smooth, synchronous, skid-proof, stable, and real-time motion.

The secondary objective of the present invention is to provide a transmission system, where no dust and pollution are produced in transport process.

The third objective of the present invention is to provide a transmission system, where the carrier can be transported both in forward and backward motion for a recycle system.

According to the objectives of the present invention, a transmission system comprises two or more independent chambers, in each of which a plurality of shafts are provided for rolling in synchronous motion. There are at least two gears at both sides of each shaft. A carrier is rested on the shafts and a plurality of adjustable gear devices is assembled on a bottom thereof. Each of the adjustable gear devices has a base, a movable rack member, vertical springs and horizontal springs. The movable rack member is connected to the base to be moved along a horizontal direction. The vertical springs are provided between the base and the carrier to urge the adjustable gear device along a vertical direction and to keep the base away from the carrier for a predetermined distance. The horizontal springs are provided between the base and the movable rack member to urge the movable rack member along the horizontal direction to adjust its position and phase of the movable rack member. Because the teeth of the rack is usually out of mesh with the corresponding teeth of the gear during the crossing chamber process, the carrier may be jammed or escaped if the fixed and continuous rack member is applied. However, the movable rack member of the self-adjustable gear device has a rack portion to be meshed with the gears of the shafts due to the effect of horizontal springs, such that the carrier is moved by the gears to cross the chambers. A movement of the movable rack member along the horizontal direction provides the rack portion a slight tolerance to be meshed with the gear of the next chamber. A movement of the movable rack member along the vertical direction provides the rack portion to be meshed with the gears in the next chamber because there is a height difference between the gears in the neighboring chambers. Moreover, it can be served as a buffer or absorber if a slight impact is happened during the crossing chamber process.

BRIEF DESCRIPTION OF THE DRAWINGS

FIG. 6A to FIG. 6H are sketch diagrams of the preferred embodiment of the present invention, wherein FIG. 6A to FIG. 6D show the horizontal motion of the adjustable gear device in forward transportation, and FIG. 6E to FIG. 6H show the horizontal motion the adjustable gear device in backward transportation;

FIG. 8A to FIG. 8H are sketch diagrams of the preferred embodiment of the present invention, wherein FIG. 8A to FIG. 8D show the vertical motion of the adjustable gear device in forward transportation, and FIG. 8E to FIG. 8H show the vertical motion of the adjustable gear device in backward transportation.

DETAILED DESCRIPTION OF THE INVENTION

Figure 1:
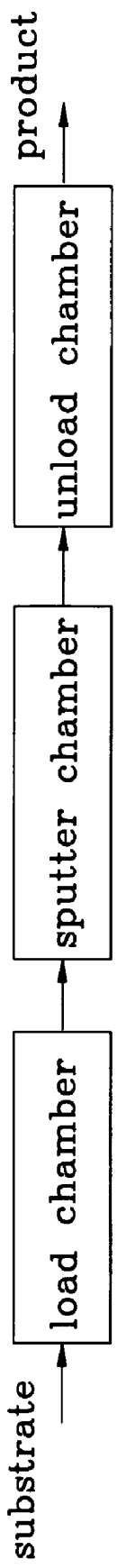
FIG. 1 is a flow chart of the in-line sputtering process.
Figure 2:
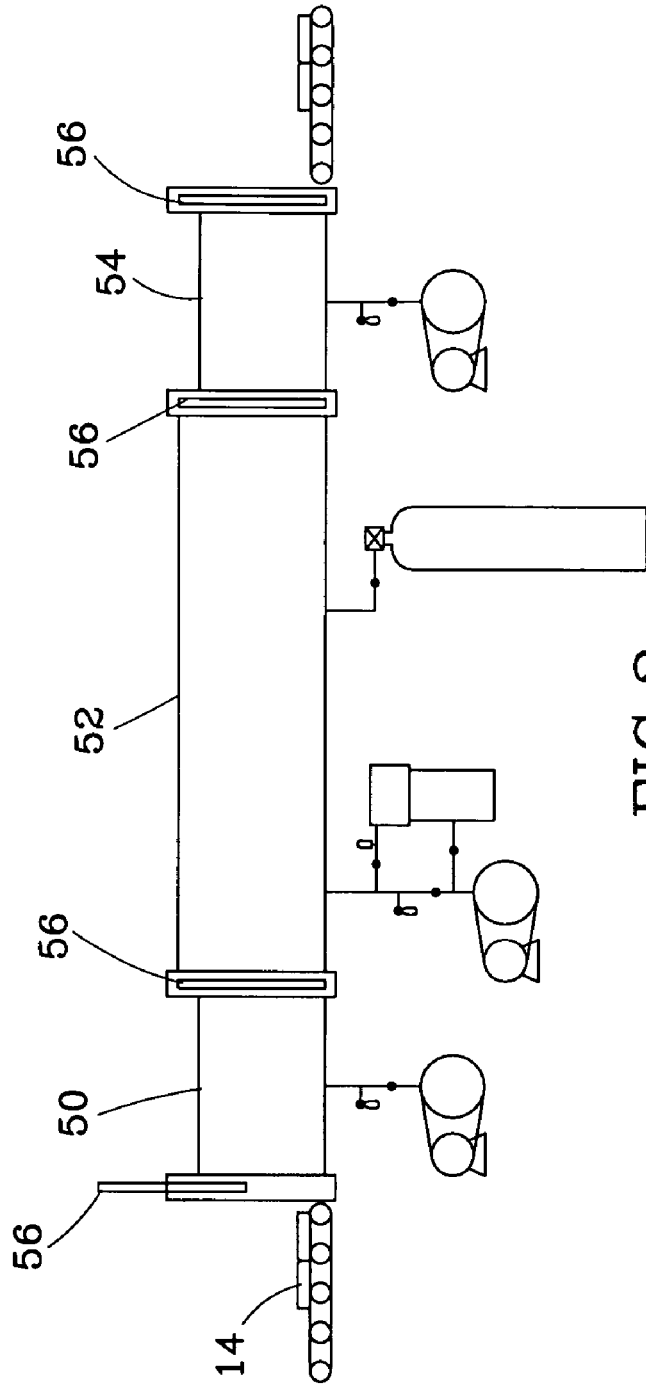
FIG. 2 is a sketch diagram of the sputtering system.
Figure 3:
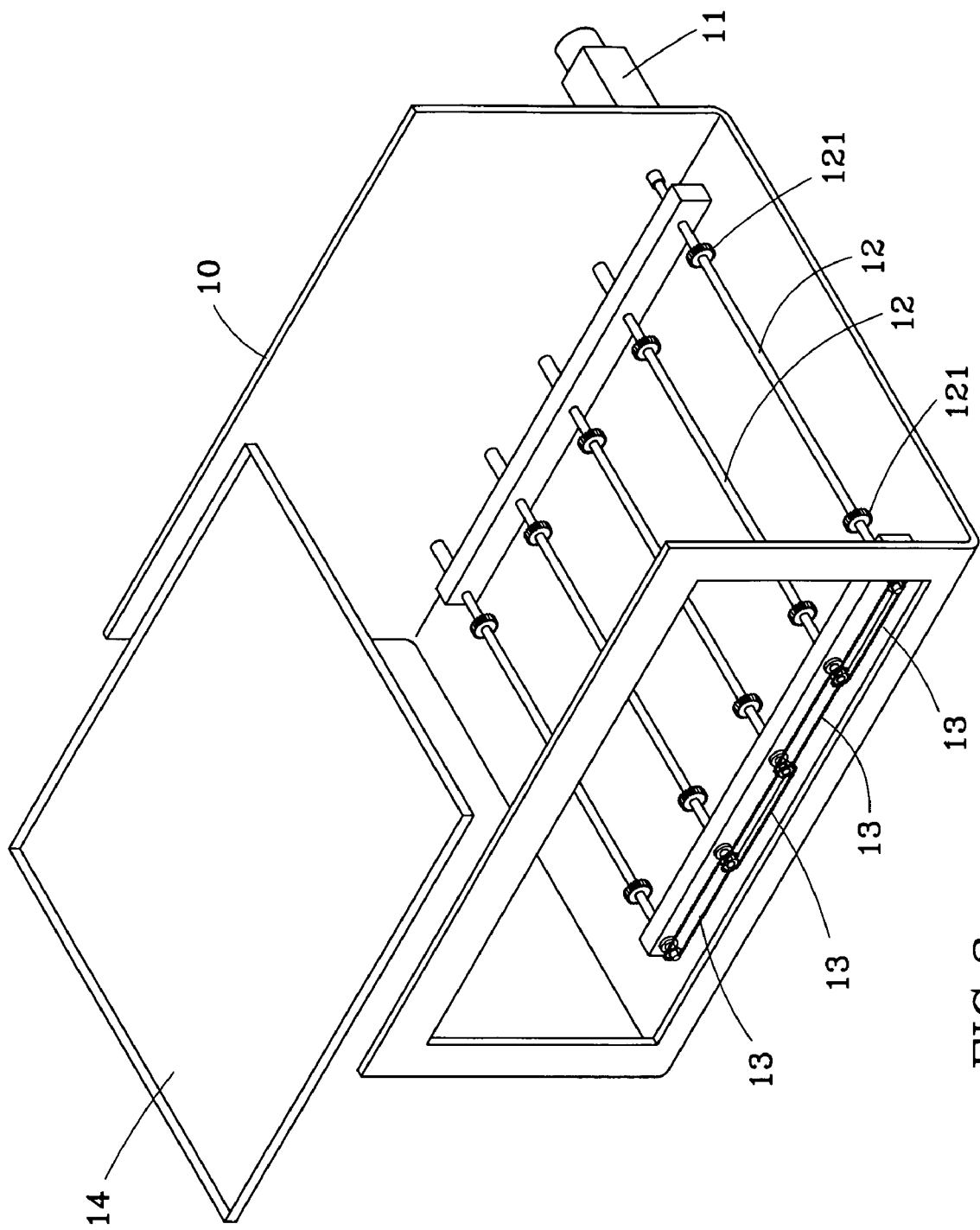
FIG. 3 is a perspective view of a preferred embodiment of the present invention.
Figure 4:
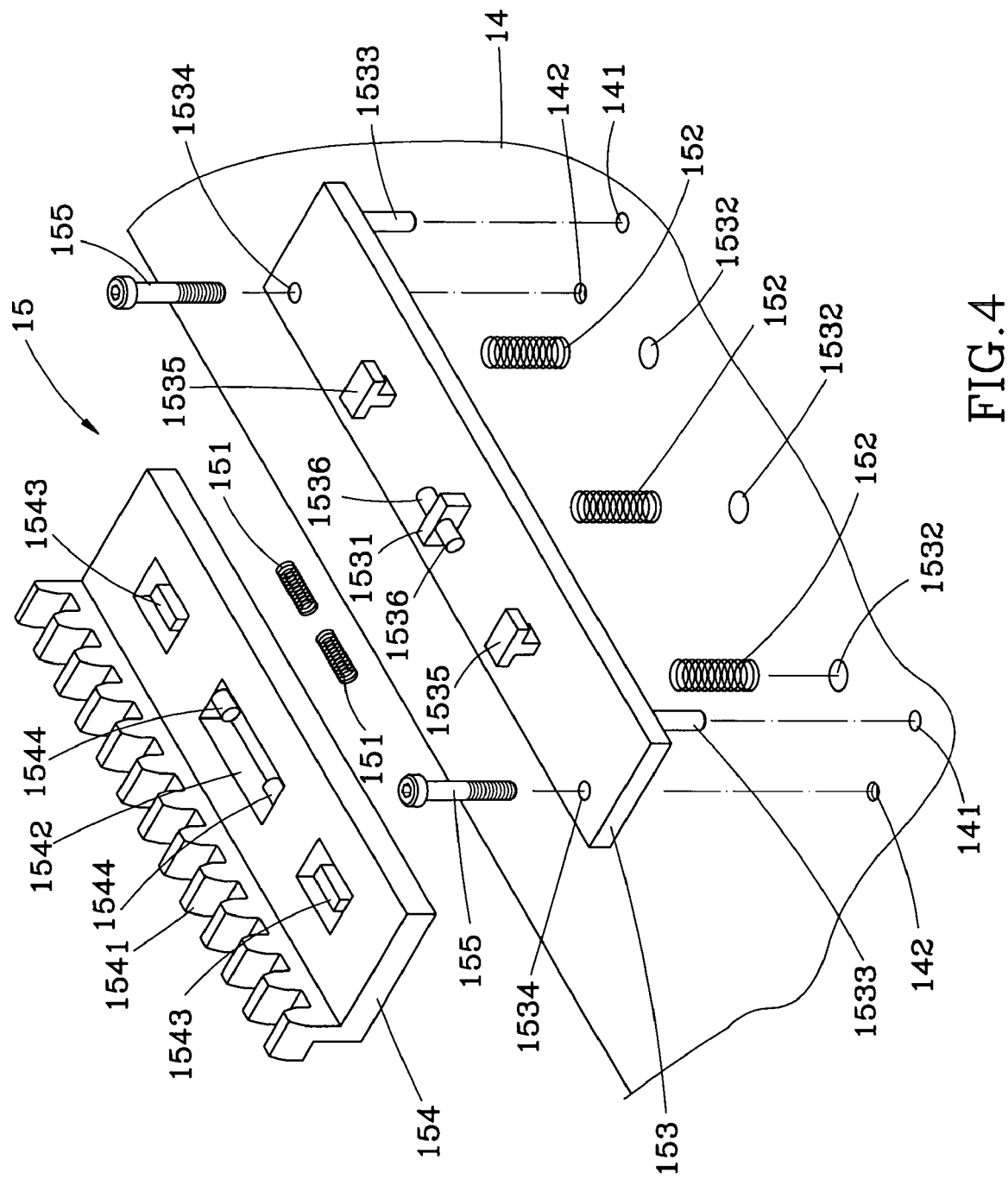
FIG. 4 is an exploded view of the adjustable gear device of the preferred embodiment of the present invention.
Figure 7:
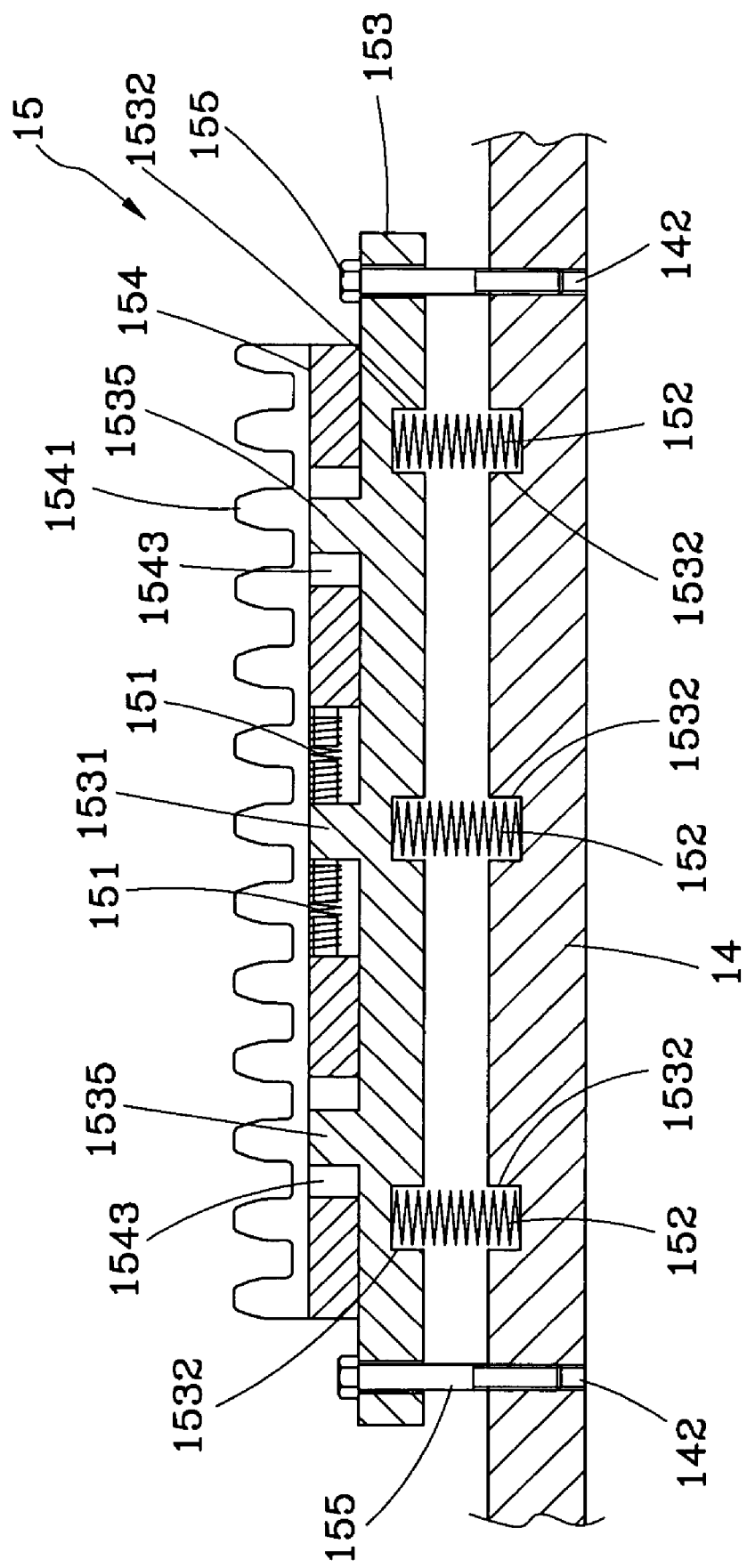
FIG. 7 is a sectional view of the adjustable gear device of the preferred embodiment of the present invention.

As shown in FIG. 3, a transmission system of the preferred embodiment of the present invention has two or more independent chambers 10, in each of which a motor 11 and six shafts 12 are provided. Each of the shafts 12 has two gears 121. The shafts 12 are connected with each other by chains 13 for synchronous motion. The motor 11 are connected to one of the shafts 12, such that the gears 121 of the shafts 12 are driven. A carrier 14 has six adjustable gear devices 15 on a bottom thereof shown in FIG. 5. As shown in FIG. 4, the adjustable gear device 15 includes two horizontal springs 151, three vertical springs 152, a base 153, and a movable rack member 154. The base 153 has two posts 1533, three recesses 1532 (seeing FIG. 7) on a bottom thereof, two T-shaped blocks 1535 and a spring mount 1531 on a top thereof with two posts 1536 on opposite sides. The base 153 further has two bores 1534. The carrier 14 has the bores 141 associated with the posts 1533, threaded holes 142 associated with the bores 1534, and recesses 1532 associated with the recesses 1532 of the bases 153 of the adjustable gear devices 15. The posts 1533 of the bases 153 are inserted into the bores 141 of the carrier 14 respectively, and bolts 155 are inserted into the bores 1534 of the bases 153 and screwed into the threaded holes 142 of the carrier 14 respectively. The vertical springs 152 are provided between each base 153 and the carrier 14 with opposite ends thereof received in the recesses 1532 respectively, such that there is a vertical slight tolerance and absorptive effect between the base 153 and the carrier 14 for a vertical movement of the base 153, shown in FIG. 7. At the moment when the teeth of the rack 154 is out of mesh with the corresponding teeth of the gear 121 during the crossing chamber process, the base 153 is distal to the carrier 14 initially and then is compressed toward the carrier 14 as shown in FIGS. 8A and 8E. The vertical springs 152 provide a recover force to the base 153. The movable rack member 154 has a rack portion 1541 at a margin thereof, three slots 1542 and 1543 and two posts 1544 on opposite ends of the slot 1542. The movable rack member 154 is installed on the top of the base 153 with the blocks 1535 received in the slots 1543 and the spring mount 1531 received in the slots 1542. The horizontal springs 151 are engaged with the posts 1536 and 1544 respectively. As a result, the movable rack member 154 can be moved horizontally relative to the base 153 in opposite directions. The blocks 1535 of the base 153 and the slots 1543 of the movable rack member 154 restrict and constrain the distance of the horizontal motion of the movable rack member 154. While the movable rack member 154 is moved away from the initial location to be meshed with the gear 121, one of the horizontal springs 151 is compressed and the other 151 is tensional to provide a horizontal slight tolerance and recover force.

Figure 5:
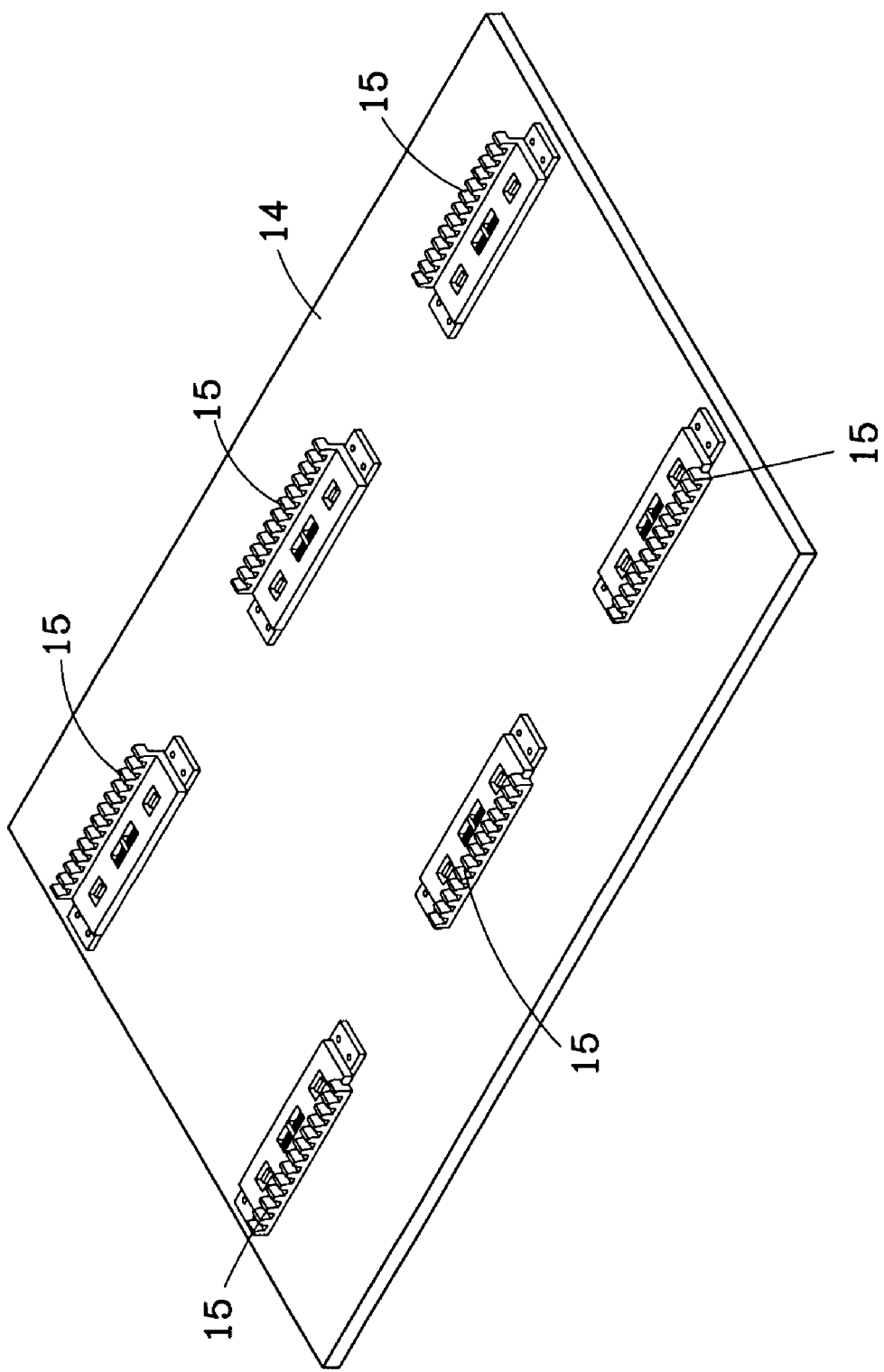
FIG. 5 is a bottom view of the carrier of the preferred embodiment of the present invention, showing the layout of the adjustable gear devices.

The adjustable gear devices 15 are arranged and assembled in a predetermined pattern on the bottom of the carrier 14. FIG. 5 shows the adjustable gear devices 15 are arranged in two lines. The locations of the adjustable gear devices 15 are associated with the gears 121 of the shafts 12. The carrier 14 is rested on the shafts 12 in the chamber 10 with the rack portions 1541 of the adjustable gear devices 15 meshed with the gears 121 of the shafts 12, such that rolling of the shafts 12 transports the carrier 14 through the chamber 10 and crossing the chambers 10.

Figure 9A:
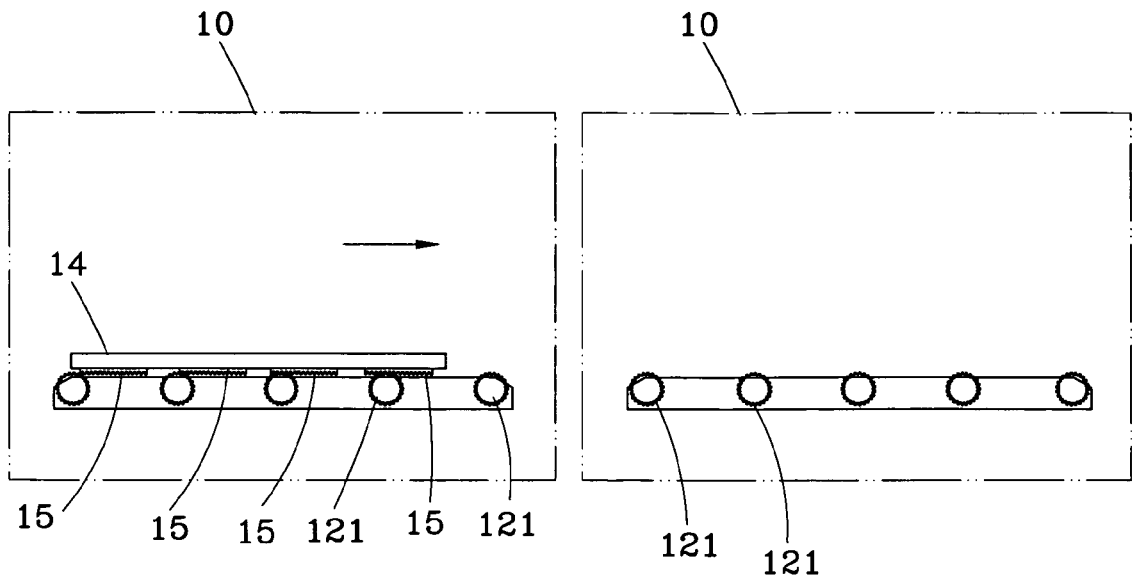
FIG. 9A to FIG. 9C are sketch diagrams of the preferred embodiment of the present invention showing the carrier crossing the chambers.
Figure 9B:
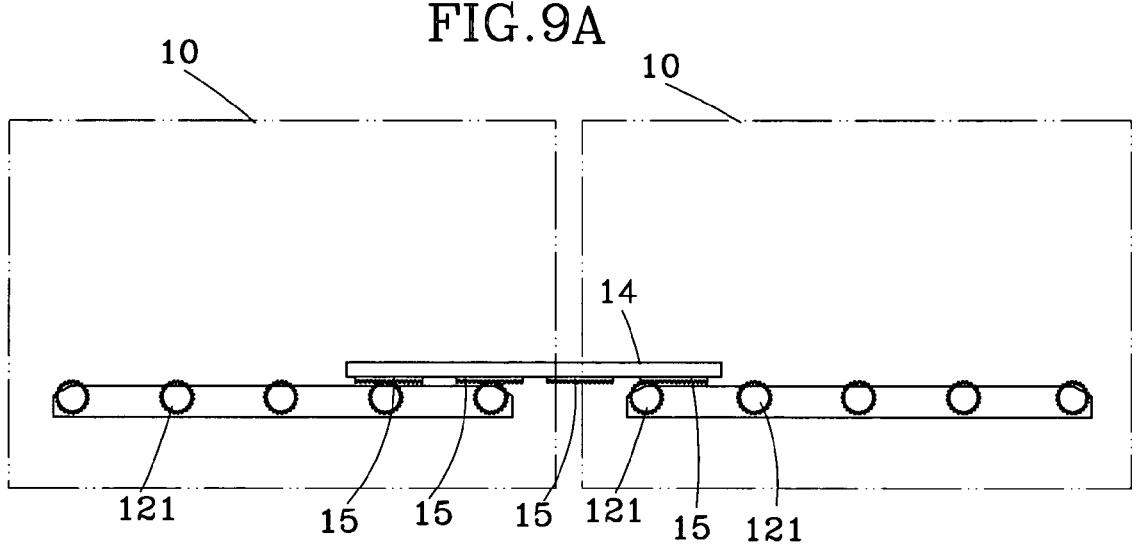
Figure 9C:
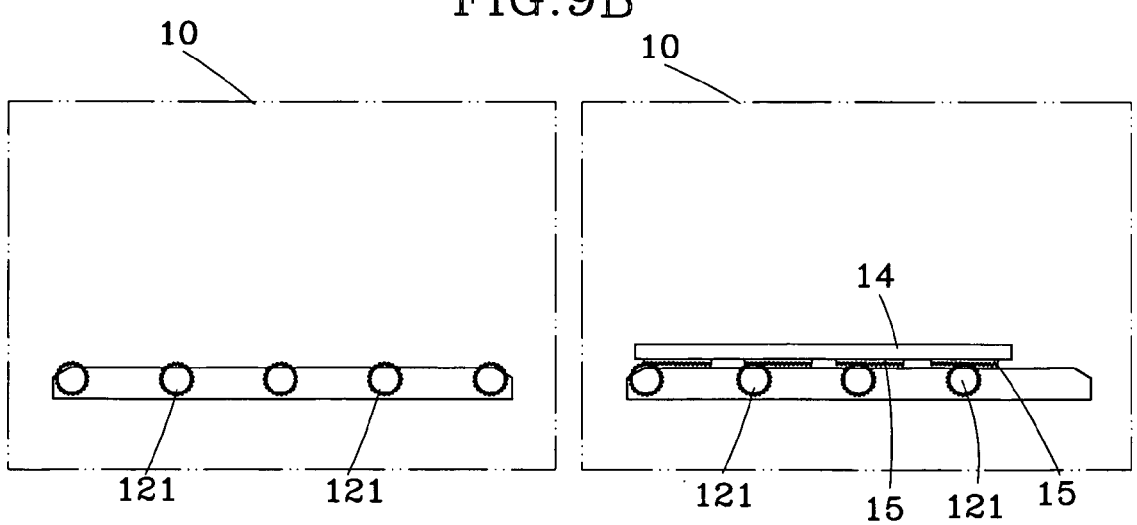

As shown in FIGS. 9A to 9C, the adjustable gear devices 15 of the present invention work in the condition of transporting the carrier 14 crossing the chambers 10. As shown in FIGS. 6A to 6D, while the carrier 14 is moved forwards to a position where the rack portion 1541 of the adjustable gear device 15 is going to mesh with the gear 121 (FIG. 6A). If the rack portion 1541 and the gear 121 are out of phase, which means that the teeth of the rack portion 1541 cannot be meshed with the gear 121, the movable rack member 154 is driven by the gear 121 automatically for slight self-adjustment (FIG. 6B). One of the horizontal springs 151 is compressed by the movable rack member 154, and the other is extended. As a result, the teeth of the rack portion 1541 and the gear 121 are in phase to be meshed with each other (FIG. 6C). Until the adjustable gear device 15 is moved away from the gear 121, as shown in FIG. 6D, the horizontal springs 151 recover the movable rack member 154 back to its initial location. FIGS. 6E to 6H show the carrier 14 is moved backwards. The adjustable gear devices 15 function as same as above but in opposite direction.

For more smooth transfer during the crossing chamber process, the heights of the first and last teeth of the rack portion 1541 can be designed to be shorter and lower than the others that make the rack portion 1541 meshed with the gear 121 easier at initial.

While the neighboring chambers 10 are little different in height that means there is a height difference between the gears 121 in the chambers 10. As shown in FIGS. 8A to 8H, the vertical springs 152 give the movable rack member 154 a vertical slight tolerance to overcome the height difference of the gears 121.

In conclusion, the present invention provides the adjustable gear devices 15 on the bottom of the carrier 14. Each adjustable gear device 15 has the movable rack member 154, which is movable in both of vertical and horizontal directions. With the horizontal movement of the movable rack member 154, the rack portion 1541 is self-adjustable to be meshed with the gears 121 in the next chamber 10 while the carrier 14 is crossing the chambers 10. With the vertical movement of the movable rack member 154, the rack portion 1541 is self-adjustable to overcome the height difference between the gears 121 in neighboring chambers 10 and to serve as an absorber while the carrier 14 is crossing the chambers 10.

What is claimed is:

1. A transmission system, comprising:

two or more independent chambers, in each of which a plurality of shafts are provided for rolling in synchronous motion; each of the shafts having at least a gear, and a carrier having a plurality of adjustable gear devices on a bottom thereof;

each of the adjustable gear devices having a base, a movable rack member, vertical springs and horizontal springs, wherein the movable rack member is connected to the base to be moved along a horizontal direction, and the vertical springs are provided between the base and the carrier to urge the adjustable gear device along a vertical direction and to keep the base away from the carrier for a predetermined distance, and the horizontal springs are provided between the base and the movable rack member to urge the movable rack member along the horizontal direction for return of the movable rack member;

the movable rack member of the adjustable gear device having a rack portion to be meshed with the gears of the shafts, such that the carrier is moved by the gears to cross the chambers, wherein a movement of the movable rack member along the horizontal direction provides the rack portion a tolerance to be meshed with the gear in the next chamber, and a movement of the movable rack member along the vertical direction provides the rack portion to be meshed with the gears in the next chamber while there is a height difference between the gears in the neighboring chambers, wherein the bases of the adjustable gear devices are provided with a block respectively, and the movable rack members of the adjustable gear devices are provided with a slot respectively to receive the blocks therein respectively, wherein a length of the slot along the horizontal direction is larger than that of the block.

2. The transmission system as defined in claim 1, wherein the carrier is provided with recesses, and the bases of the adjustable gear devices are provided with recesses, and the vertical springs have ends received in the recesses of the carrier and the bases of the adjustable gear devices respectively.

3. The transmission system as defined in claim 1, wherein the carrier is provided with bores, and the bases of the adjustable gear devices are provided with posts received in the bores respectively.

4. The transmission system as defined in claim 1, wherein the carrier is provided with threaded holes, and the bases of the adjustable gear devices are provided with bores aligned with the threaded holes respectively, and bolts are inserted in the bores of the bases and screwed into the threaded holes respectively.

5. A transmission system, comprising:
two or more independent chambers, in each of which a plurality of shafts are provided for rolling in synchronous motion; each of the shafts having at least a gear, and
a carrier having a plurality of adjustable gear devices on a bottom thereof;

each of the adjustable gear devices having a base, a movable rack member, vertical springs and horizontal springs, wherein the movable rack member is connected to the base to be moved along a horizontal direction, and the vertical springs are provided between the base and the carrier to urge the adjustable gear device along a vertical direction and to keep the base away from the carrier for a predetermined distance, and the horizontal springs are provided between the base and the movable rack member to urge the movable rack member along the horizontal direction for return of the movable rack member;

the movable rack member of the adjustable gear device having a rack portion to be meshed with the gears of the shafts, such that the carrier is moved by the gears to cross the chambers, wherein a movement of the movable rack member along the horizontal direction provides the rack portion a tolerance to be meshed with the gear in the next chamber, and a movement of the movable rack member along the vertical direction provides the rack portion to be meshed with the gears in the next chamber while there is a height difference between the gears in the neighboring chambers, wherein the bases of the adjustable gear devices are provided with a spring mount respectively, and the movable rack members of the adjustable gear devices are provided with a slot respectively to receive the spring mounts therein respectively, wherein the horizontal springs has opposite ends against ends of the slots and the spring mount respectively.

6. The transmission system as defined in claim 5, wherein the movable rack member is provided with two posts on the ends of the slots, and the base is provided with two posts on opposite sides of spring mount, wherein the horizontal springs have the opposite ends engaged with the posts respectively.

* * * * *